US008405026B2

(12) United States Patent
Shojo et al.

(10) Patent No.: US 8,405,026 B2
(45) Date of Patent: Mar. 26, 2013

(54) CHARGED PARTICLE BEAM APPARATUS

(75) Inventors: Tomoyasu Shojo, Kokubunji (JP);
Muneyuki Fukuda, Kokubunji (JP);
Naomasa Suzuki, Hitachinaka (JP);
Noritsugu Takahashi, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 296 days.

(21) Appl. No.: 12/554,275

(22) Filed: Sep. 4, 2009

(65) Prior Publication Data
US 2010/0059676 A1    Mar. 11, 2010

(30) Foreign Application Priority Data
Sep. 5, 2008  (JP) .................................. 2008-228609

(51) Int. Cl.
*H01J 3/14*    (2006.01)
*G01N 23/00*    (2006.01)
(52) U.S. Cl. .......................... 250/311; 250/306; 250/397
(58) Field of Classification Search .......... 250/306–311, 250/397
See application file for complete search history.

(56) References Cited

U.S. PATENT DOCUMENTS

| 4,626,689 | A | * | 12/1986 | Tomita et al. ............. 250/396 R |
| 4,724,319 | A | * | 2/1988 | Shirota ......................... 250/307 |
| 5,003,173 | A | * | 3/1991 | De Jong ....................... 250/311 |
| 5,124,556 | A | * | 6/1992 | Takashima ................ 250/396 R |
| 5,225,676 | A | * | 7/1993 | Matsuya ....................... 250/310 |
| 5,767,515 | A | * | 6/1998 | Honda .......................... 250/310 |
| 6,570,156 | B1 | * | 5/2003 | Tsuneta et al. ................ 250/311 |
| 6,822,233 | B2 | * | 11/2004 | Nakamura et al. ............ 250/311 |
| 6,933,512 | B2 | * | 8/2005 | Matsuya ................... 250/492.22 |
| 6,946,670 | B1 | * | 9/2005 | Zurbrick .................. 250/559.06 |
| 7,214,936 | B2 | * | 5/2007 | Sato et al. ...................... 250/310 |
| 7,241,996 | B2 | * | 7/2007 | Suzuki et al. ................. 250/310 |
| 7,372,051 | B2 | * | 5/2008 | Tsuneta et al. ............. 250/492.3 |
| 7,435,960 | B2 | * | 10/2008 | Suzuki et al. ................. 250/310 |
| 7,442,929 | B2 | * | 10/2008 | Kitsuki et al. ................. 250/310 |
| 7,504,624 | B2 | * | 3/2009 | Kawasaki et al. ............. 250/310 |

(Continued)

FOREIGN PATENT DOCUMENTS

JP    08-315761    11/1996

OTHER PUBLICATIONS

Sato et al. "Evaluation of depth of field in SEM images in terms of the information-passing capacity (IPC) and contrast gradient in SEM image" Nuclear Instruments and Methods in Physics Research A 519 (2004) 280-285.*

*Primary Examiner* — David A Vanore
*Assistant Examiner* — Wyatt Stoffa
(74) *Attorney, Agent, or Firm* — Antonelli, Terry, Stout & Kraus, LLP.

(57) ABSTRACT

Disclosed herewith is a charged particle beam apparatus capable of controlling each of the probe current and the objective divergence angle to obtain a desired probe current and a desired objective divergence angle in accordance with the diameter of the subject objective aperture. The apparatus is configured to include an objective aperture between first and second condenser lenses to calculate and set a control value of a first condenser lens in accordance with the diameter of the hole of the objective aperture so as to obtain a desired probe current and calculate a control value of a second condenser lens setting device in accordance with the diameter of the hole of the objective divergence angle and the control value of the second condenser lens setting device, thereby setting the calculated control value for the second condenser lens setting device to control the objective divergence angle.

3 Claims, 8 Drawing Sheets

U.S. PATENT DOCUMENTS

| | | | |
|---|---|---|---|
| 7,523,009 B2 * | 4/2009 | Preikszas et al. | 702/107 |
| 7,528,394 B2 * | 5/2009 | Matsuba | 250/492.3 |
| 7,550,724 B2 * | 6/2009 | Ichimura et al. | 250/310 |
| 7,692,163 B2 * | 4/2010 | Nagano | 250/492.2 |
| 7,741,601 B2 * | 6/2010 | Noji et al. | 250/310 |
| 7,791,023 B2 * | 9/2010 | Kasai et al. | 250/311 |
| 7,807,966 B2 * | 10/2010 | Kitsuki et al. | 250/311 |
| 7,888,640 B2 * | 2/2011 | Tachibana et al. | 250/310 |
| 7,888,642 B2 * | 2/2011 | Nakasuji et al. | 250/310 |
| 2002/0079448 A1 * | 6/2002 | Ishitani et al. | 250/310 |
| 2004/0029046 A1 * | 2/2004 | Nagano et al. | 430/296 |
| 2006/0226362 A1 * | 10/2006 | Kitsuki et al. | 250/310 |
| 2007/0181807 A1 * | 8/2007 | Fukuda et al. | 250/310 |
| 2008/0100832 A1 * | 5/2008 | Sato et al. | 356/237.5 |
| 2008/0283744 A1 * | 11/2008 | Takada et al. | 250/307 |
| 2009/0314938 A1 * | 12/2009 | Sato et al. | 250/307 |
| 2010/0051806 A1 * | 3/2010 | Sasaki et al. | 250/310 |
| 2010/0116984 A1 * | 5/2010 | Ogawa et al. | 250/307 |
| 2010/0237243 A1 * | 9/2010 | Noji et al. | 250/310 |

* cited by examiner

FIG. 9

FIRST MODE

| APERTURE DIAMETER [μm] | VALUE OF CONDENSER LENS SETTING DEVICE 60 [A] | VALUE OF CONDENSER LENS SETTING DEVICE 62 [A] |
|---|---|---|
| . . | . . | . . |
| 99 | 0.49 | 0.62 |
| 100 | 0.50 | 0.60 |
| 101 | 0.51 | 0.58 |
| . . | . . | . . |

SECOND MODE

| APERTURE DIAMETER [μm] | VALUE OF CONDENSER LENS SETTING DEVICE 60 [A] | VALUE OF CONDENSER LENS SETTING DEVICE 62 [A] |
|---|---|---|
| . . | . . | . . |
| 99 | 0.59 | 0.52 |
| 100 | 0.60 | 0.50 |
| 101 | 0.61 | 0.48 |
| . . | . . | . . |

THIRD MODE

| APERTURE DIAMETER [μm] | VALUE OF CONDENSER LENS SETTING DEVICE 60 [A] | VALUE OF CONDENSER LENS SETTING DEVICE 62 [A] |
|---|---|---|
| . . | . . | . . |
| 99 | 0.29 | 0.72 |
| 100 | 0.30 | 0.70 |
| 101 | 0.31 | 0.68 |
| . . | . . | . . |

CHARGED PARTICLE BEAM APPARATUS

CLAIM OF PRIORITY

The present application claims priority from Japanese patent application JP 2008-228609 filed on Sep. 5, 2008, the content of which is hereby incorporated by reference into this application.

FIELD OF THE INVENTION

The present invention relates to a technique for manufacturing a substrate having circuit patterns, particularly to a charged particle beam inspection technique for inspecting fine circuit patterns with use of a charged particle beam.

BACKGROUND OF THE INVENTION

A scanning electron microscope (hereunder, to be described as the SEM) is an apparatus for accelerating primary electrons discharged from an electron source, rectifies the primary electrons through an objective aperture, focusing the same by an objective lens to narrow down the primary electrons, scanning the sample with the primary electron beam by using a scanning deflector, detecting secondary signals generated from the sample by the irradiation of the primary electron beam, and displays the intensity of this detected signal as an observation image.

In manufacturing processes of a large scale integrated circuit, a review apparatus is usually used to analyze defects detected in an inline wafer inspection quickly and apply the result of the analysis to the removing process of the defects. This is why the review apparatus is employed widely to establish the manufacturing yield quickly and stabilize the operation of the manufacturing processes. And now that defects that might affect the semiconductor manufacturing yield adversely are getting fine and fine along with the advanced miniaturization of the manufacturing processes, there has been strongly demanded to realize an SEM review apparatus capable of reviewing the object with higher resolution than that of the conventional optical review apparatus. Basically, the configuration of the reviewing SEM is the same as that of the SEM.

In case of the review SEM, defects are classified in the following procedure. At first, an object semiconductor wafer is put on a wafer stage to fetch defect coordinates from an optical inspection apparatus. Then, the wafer is moved to the reference coordinates having the same wiring pattern as that of the defect coordinates to be focused on. The reference coordinates are observed at a low magnification. In the focusing process, the surface height of the wafer is measured with a laser measuring device to set an excitation current of the objective lens according to the measured value. After this, the wafer is moved to the defect coordinates and focused similarly to the method used for the reference coordinates to observe the defect coordinates at a low magnification. The image of the reference coordinates is then compared with the image of the defect coordinates to identify the details of the defect position, then detect a position having a difference between those two images, photograph the observed image at the defect position at a high magnification to observe the defect more in detail, and analyze the observed image automatically to classify the defect and its related foreign matters. Such a flow of operations is repeated with use of an automatic defect review (ADR) function, so that obtaining and classifying such an observed image are carried out for several thousands of defects per hour.

In order to achieve a high detection rate of defects by preventing failing of defect locating, it is required to obtain clear observed images of both reference coordinates and defect coordinates. If an observed image is dim, comparison cannot be made correctly between those images. Furthermore, because the measurement accuracy of the laser measuring device is in the order of μm, the same accuracy is also required for the focusing. The review SEM is thus designed so as to improve the accuracy more than that of the laser measuring device with respect to the focal depth that represents a distance between before and after the subject focal point to obtain clear observed images. The focal depth is in inverse proportion to the objective divergence angle, which is a half of the angle at which a primary electron beam is irradiated into the object sample.

On the other hand, the sizes of the defects to be observed are varied in the order of several tens of nm and high resolution in the order of several nm is required to observe such fine defects. Within such an objective divergence angle having a practical focal depth, the resolution is improved in proportion to the objective divergence angle.

The optical mode is optional; it can be selected properly among those having different amounts of the primary electron beam irradiated into the sample (hereunder, to be described as a probe current) and different objective divergence angles according to how the review SEM is used. As typical examples of such optical modes, there are an optical mode that takes precedence to small probe current and resolution (hereunder, to be referred to as a high resolution mode), an optical mode that takes a valance between focal depth and resolution (hereunder, to be referred to as a review mode), an optical mode that takes precedence to focal depth (hereunder, to be referred to as a long focal depth mode), etc.

In case of a small probe current, many images must be integrated to obtain an observed image with a high signal-to-noise (hereunder, to be described as the S/N) ratio, thereby the inspection throughput is lowered. In case of a high probe current, integration of less images is required, thereby the throughput is raised. In case of the high probe current, however, resolution is lowered more than the case in which the probe current is small.

Selecting an optical mode means selecting a balance between focal depth and resolution, as well as selecting a probe current. The optical mode selection is the most important parameter for the review SEM. In each optical mode, therefore, the balance between focal depth and resolution is determined severely in the design stage. And in order to determine those two performance requirements, the objective divergence angle must be set accurately. The probe current is determined by the amount of the primary electron beam that passes through the objective aperture.

In case of the review SEM described above, the objective aperture is often contaminated with foreign matters, etc. when the apparatus is started up or while the apparatus is running, thereby images are apt to be degraded. And in order to prevent this, the objective aperture is replaced once or so every year. In spite of this, the objective aperture is unavoidably variable in its diameter; the variation comes to be more than 10% among the manufacturing process and both the objective divergence angle and the probe current also come to be varied more than 10% due to the replacement of the objective aperture. Such a variation of the objective aperture diameter among the manufacturing process comes to lead to an imbalance between the focal depth and the resolution even when they are designed severely in each optical mode, resulting in generation of a performance difference between apparatuses and this makes it difficult to assure the apparatus performance.

Some general means capable of adjusting such an objective divergence angle that realizes the maximum resolution upon replacing the objective aperture with a new one have been disclosed as condenser lens adjusting methods. JP-A No. 08 (1996)-315761 discloses a technique that can adjust such an objective divergence angle by measuring the objective aperture diameter disposed between a condenser lens and an objective lens and by feeding back the measured value to the condenser lens.

In case of the configuration employed in JP-A No. 08 (1996)-315761, however, if the objective divergence angle is adjusted in accordance with an objective aperture diameter with use of the condenser lens setting device, the amount of the primary electron beam (hereunder, to be referred to as a probe current) that reaches the sample by passing through the objective aperture comes to change due to the location of the objective aperture disposed between a condenser lens and an objective lens, thereby the brightness of the image also comes to change. As a result, the desired probe current in the selected optical mode cannot satisfy the requirement of the defect inspection. This has been a problem.

Furthermore, according to JP-A No. 08 (1996)-315761, the objective divergence angle is adjusted by the condenser lens setting device to which a value is given beforehand to realize the maximum resolution. In case of the review SEM, it is required to configure the apparatus so as to realize a proper balance between focal depth and resolution and to stabilize the probe current to obtain a satisfactory detection rate of defects. Particularly, the focal depth must be set over the accuracy of the laser measuring instrument. The focal depth is the most important index to be required for the review SEM.

SUMMARY OF THE INVENTION

Under such circumstances, it is an object of the present invention to provide a charged particle beam apparatus capable of controlling both of a probe current and an objective divergence angle.

In order to realize the above object, the charged particle beam apparatus of the present invention is configured to include a scanning device that irradiates a desired region of a sample with a primary charged particle beam; a display device that displays secondary charged particles generated from the region irradiated by the primary charged particle beam as an image; a first condenser lens that focuses the primary charged particle beam on the sample; a second condenser lens disposed closer to the sample than the first condenser lens; an objective aperture disposed between the first and second condenser lenses; a first lens setting device that sets an excitation value of the first condenser lens; a second lens setting device that sets an excitation value of the second condenser lens; and a controller that controls the second condenser lens setting device to obtain a desired objective divergence angle with respect to a given diameter of the objective aperture.

In the charged particle beam apparatus of the present invention, the controller further controls each of the primary charged particle beam amount and the objective divergence angle independently. Furthermore, the controller also controls the first condenser lens setting device to obtain a desired probe current in accordance with the diameter of the objective aperture.

Furthermore, the charged particle beam apparatus of the present invention also includes a memory device that stores a control value of the first condenser lens setting device used to obtain a desired value for the amount of the primary charged particle beam to be irradiated into the sample with respect to a given diameter of the objective aperture, as well as a control value of the second condenser lens setting device so as to obtain a desired objective divergence angle with respect to the given control value of the first condenser lens setting device and a given diameter of the objective aperture. The controller reads a control value corresponding to the objective aperture diameter in a specified optical mode to control each of the first and second condenser lens setting devices according to the read control value.

In another aspect, the charged particle beam apparatus of the present invention includes a scanning device that irradiates a desired region of a sample with a primary charged particle beam; a display device that displays secondary charged particles generated from the desired region irradiated by the primary charged particle beam as an image; a first condenser lens that focuses the primary charged particle beam on the sample; a second condenser lens disposed closer to the sample than the first condenser lens; an objective aperture disposed between the first condenser and the second condenser lenses; a first lens setting device and a second lens setting device used to set an excitation value for the first and second condenser lenses respectively; and a controller that controls the first and second lens setting devices. The controller controls the second lens setting device according to an initial value of the second control value and adjusts the second control value so that the difference between the detected focal depth and its setting value converges within a desired range. The controller also controls the first lens setting device according to the initial value of the first control value and adjusts the first control value so that the difference between the detected probe current and its setting value converges within a desired range.

In the review SEM that identifies an object defect by making a comparison between images of a defect position and a reference position, when the objective aperture is replaced with a new one, it is possible to adjust the new objective aperture to an objective divergence angle required for a focal depth and an objective aperture to obtain a satisfactory defect rate at the same probe current. As a result, the apparatus can find surely fine defects that have been difficult to be classified conventionally, thereby a high defect detection rate can be kept assured.

BRIEF DESCRIPTION OF THE DRAWINGS

FIG. 9 is tables for describing a relationship between values of two condenser lens setting devices in accordance with the diameter of the objective aperture in each optical mode in the first embodiment.

DETAILED DESCRIPTION OF THE PREFERRED EMBODIMENTS

Hereunder, there will be described the embodiments of the present invention with reference to the accompanying drawings.

Figure 1:
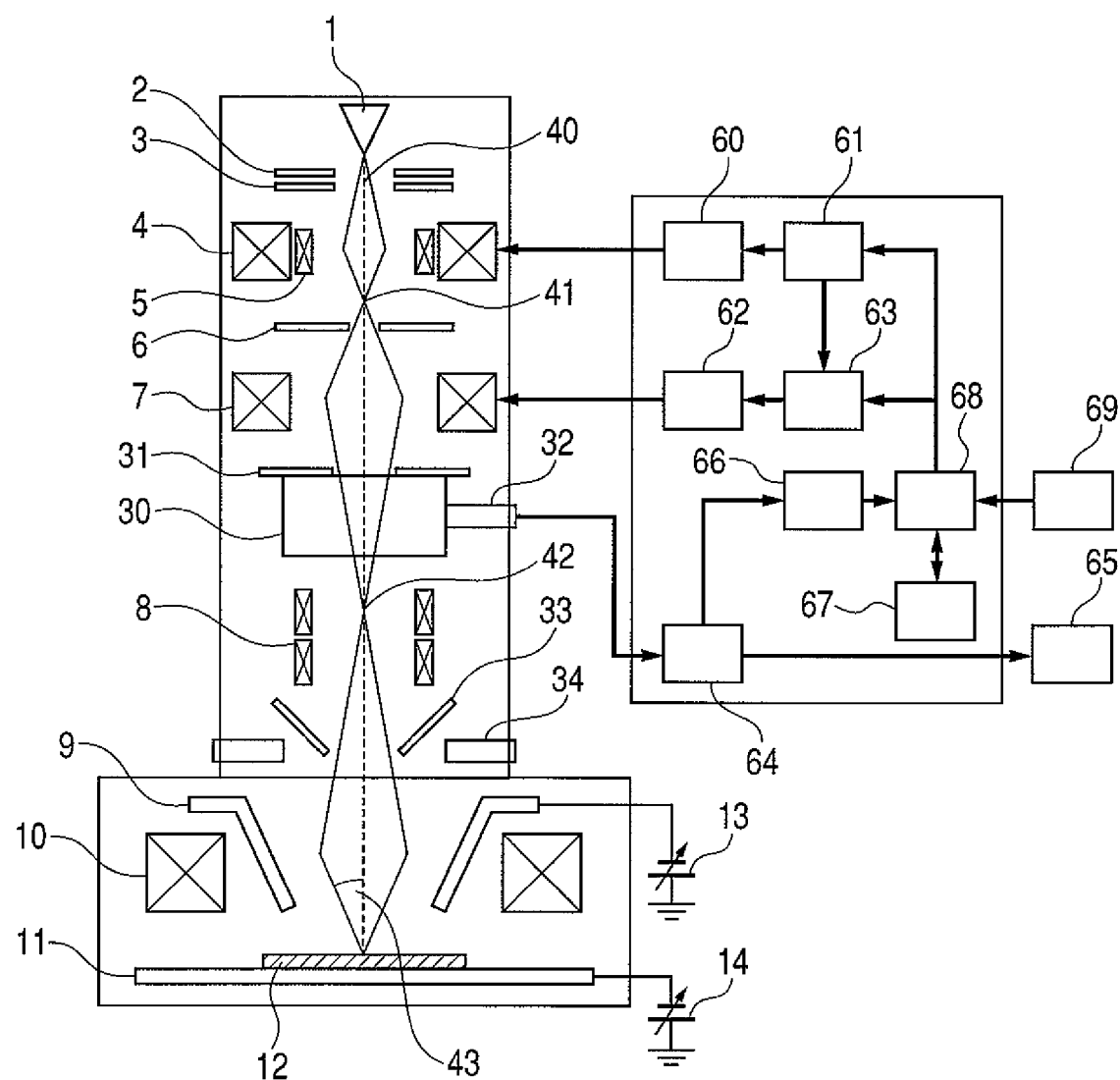
FIG. 1 is a schematic block diagram of a review SEM in a first embodiment.

FIG. 1 is a block diagram of a charged particle beam apparatus of the present invention in its basic configuration. The apparatus includes a condenser lens 4 and a condenser lens setting device 60 used to focus a primary electron beam on an object sample respectively, a condenser lens 7 and a condenser lens setting device 62 used to control an objective divergence angle, and an objective aperture 6 that limits the amount of the primary electron beam to be irradiated into an object sample disposed between the condenser lenses 4 and 7.

In this basic configuration, the apparatus uses a memory device that stores tables or equations for representing values of the condenser lens setting device 60 beforehand in accordance with a diameter of a hole 6' of the objective aperture 6 so as to obtain a desired probe current in each optical mode and tables or equations for representing values of the condenser lens setting device 62 in accordance with the diameter of the hole 6' of the objective aperture 6 and the value of the condenser lens setting device 60 so as to obtain a desired objective divergence angle.

After this, an alignment coil 13 is used to scan the objective aperture 6 secondarily, then a secondary electron detector 32 is used to detect secondary electrons. The detected electrons signal is inputted to a length measuring device 66 to measure the diameter of the hole 6' of the objective aperture 6. And according to the diameter of the hole 6' of the objective aperture 6, a value to be given to the condenser lens setting device 60 is calculated. The value is used to obtain a desired probe current in the specified optical mode and the calculated value is inputted to the condenser lens 4, thereby the probe current is adjusted to the desired value. Then, according to the measured diameter of the hole 6' of the objective aperture 6 and the value given to the condenser setting device 60, a value to be given to the condenser lens setting device 62 is calculated and inputted to the condenser lens 7. The value is used to obtain a desired objective divergence angle, thereby adjusting the objective divergence angle 43.

Each of the image display device 65, the computing device 68, and the input device 69 may be a display device such as that of an ordinary computer, a processor such as a CPU (central processing unit) and a dedicated circuit board, and an input device such as a keyboard, a mouse, or the like respectively.

First Embodiment

Next, there will be described the operation and configuration of a review SEM in this first embodiment on the basis of the charged particle beam apparatus shown in FIG. 1.

The review SEM is an electron beam application apparatus realized by employing a scanning electron microscope (SEM) that includes semi-inlens type objective lenses and it is used to detect and classify defects and foreign matters detected on semiconductor wafers. The review SEM consists of an electron optical system, an electron detection system, and a control system.

In FIG. 1, the electron optical system includes an electron source 1, an extraction electrode 2, an acceleration electrode 3, a first condenser lens 4, an alignment coil 5, an objective aperture 6, a second condenser lens 7, a scanning deflector 8, an objective lens pole-piece 9, an objective lens 10, a sample base 11, and a sample substrate (sample wafer) 12. The objective lens pole-piece 9 includes a variable booster voltage power supply 13 and the sample base 11 includes a variable retarding voltage power supply 14.

The electron detection system includes an ExB deflector 30, a reflection plate 31, a secondary electron (SE) detector 32, a reflection plate 33, and a three-dimensional image detector 34. The ExB deflector 30 is used to place an electric field and a magnetic field one upon another vertically. The deflector 30 does not deflect the primary electron beam. It deflects the secondary electrons emitted from the sample irradiated by the electron beam to fetch the SE into the SE detector 32. An image with a high S/N ratio can thus be obtained.

The control system includes condenser lens setting devices 60 and 62, lens setting device controllers 61 and 63, a detected signal processor (image processor) 64, an image display device 65, a length measuring device 66, a memory device 67, a computing device 68, and an input device 69. In this specification, the lens setting device controllers 61 and 63 are referred to as a controller generically. Furthermore, note that the controller may include the computing device 68 in some cases.

Usually, a diffusion supply type Schottky-Emission electron source is used as the electron source 1 of the electron optical system. A voltage is applied to the extraction electrode 2 to emit the primary electron beam from an electron gun. The acceleration electrode 3 receives a negative voltage −V0 and the primary electron beam passes through the acceleration electrode 3 at an energy V0. After this, the primary electron beam is focused by the condenser lens 4, thereby the amount of the primary electron beam is limited when it passes through the objective aperture 6. The primary electron beam that has passed through the objective aperture 6 is focused by the condenser lens 7. The variable retarding voltage power supply 14 of the sample base 11 is used to vary the voltage potential −Vr (retarding potential) so as to reduce the speed of the primary electron beam. This retarding potential decelerates quickly the primary electron beam just over the sample substrate 12 put on the sample base 11 while the primary electron beam is focused by the objective lens 10 on the sample substrate 12. Usually, the sample substrate 12 is scanned through the scanning deflectors 8 disposed in two steps between the condenser lens 7 and the objective lens 10. The broken line 40 shows a orbit of the primary electron beam and the point 42 shows cross-over point of the primary electron beam.

The energy of the primary electron beam becomes (V0−Vr) when the beam is irradiated into the sample substrate 12. In this first embodiment, it is premised that V0 is −2 kV and Vr is −1.2 kV while the energy of the primary electron beam irradiated into the sample substrate is assumed to be 800 eV, thereby the irradiation of the primary electron beam comes to generate secondary electrons from the sample substrate 12.

The objective lens pole-piece 9 includes a variable booster voltage power supply 13 used to apply a positive potential (booster potential) to the pole-piece 9 so as to pull up the secondary electrons. In this first embodiment, the booster potential is assumed to be 2 kV. This booster potential enables the secondary electrons to be pulled up towards the electron source side, thereby hitting the reflection plate 33. And this hitting generates secondary electrons from the reflection plate 33, which are then detected by the detector 34. The detector 34 consists of two detectors, which are disposed so as to face each other (right and left). This structure divides the secondary electrons to right and left sides so as to enable three-dimensional observation of defects and foreign matters on the sample substrate.

The secondary electrons passing through the holes of the reflection plate 33 go forward whirling up towards the electron source due to the pull-up electric field generated by the booster electrode 9 and due to the magnetic field generated by the objective lens. The whirling-up secondary electrons then come into collision with the reflection plate 31, thereby the reflection plate 31 generate secondary electrons. The secondary electrons generated from the reflection plate 31 are deflected by the ExB deflector 30 and detected by the SE detector 32. The signals detected by the detectors 32 and 34 are then sent to the image processor 64 and displayed as a scan SEM image on the image display device 65.

As described above, the review SEM is required to control the balance between focal depth and resolution, as well as the probe current. This probe current affects the inspection throughput significantly. This is because integration of many images is required to obtain an observation image with a high S/N ratio if the probe current is small. As a result, the throughput is lowered. On the other hand, if the probe current is large, less images are integrated, thereby the throughput is raised. However, if the probe current is large, the resolution is apt to be degraded more than when the probe current is small. This has been a problem. The probe current is determined by the amount of the primary electron beam passing through the objective aperture 6, that is, the position of the cross-over point 41. The closer the cross-over point 41 is disposed with respect to the objective aperture 6, the larger the probe current becomes. This cross-over point 41 is controlled by the value given to the lens setting device 60.

The balance between focal depth and resolution affects both of the detection rate and the detailed observation of defects. As described above, the review SEM measures the surface height of each object wafer with use of its laser measuring device and the measured value is used to set an excitation current of the objective lens, thereby adjusting the focusing. In order to achieve a high defect detection rate without failing in locating of defect positions, reference coordinates and defect coordinates must be clear. If an observed image is dim, the image cannot be compared with another image. Usually, because the measurement accuracy of the laser measuring device is in the order of several μm, the focal depth that represents a distance that enables clear images to be obtained before and after the focal point must be over the accuracy of the laser measuring device.

Figure 5:
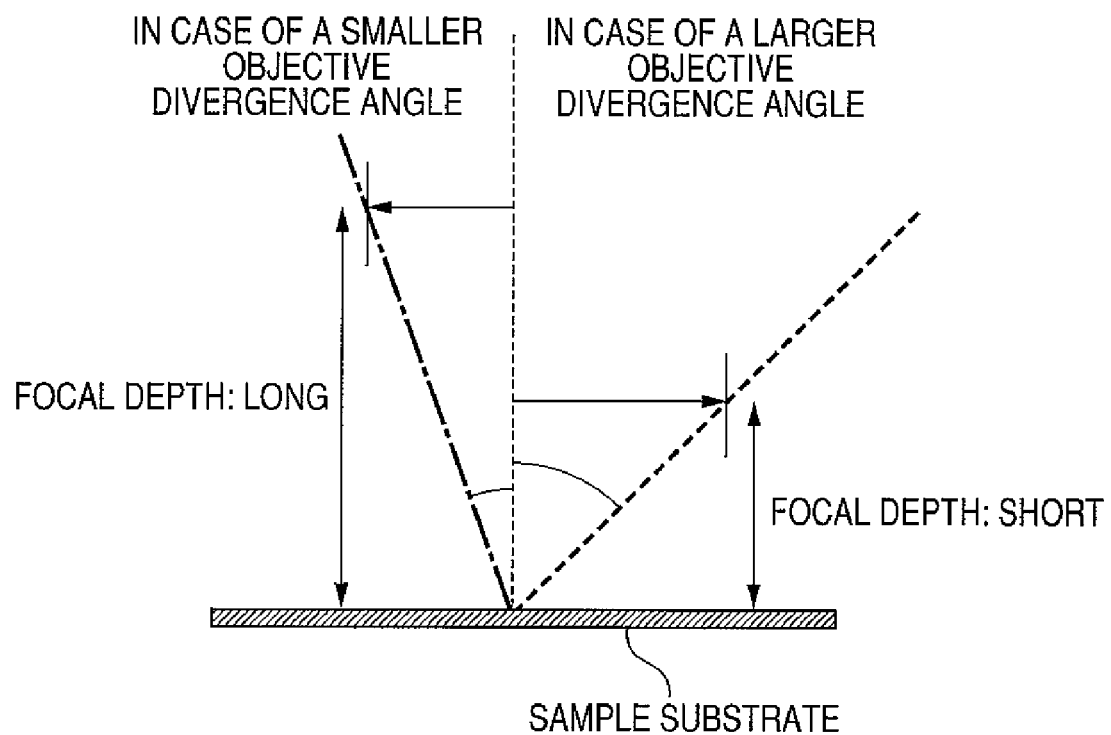
FIG. 5 is an explanatory graph of orbits of a primary electron beam irradiated into a sample in each embodiment.

FIG. 5 is an explanatory view of orbits along each of which the primary electron beam is irradiated into an object sample. The left side orbit is assumed when the objective divergence angle is small and the right side orbit is assumed when the objective divergence angle is large. It would be understood from this FIG. 5 that the vertical distance is longer when the objective divergence angle is small while those orbits are the same in beam diameter. The length of the focal depth and the objective divergence angle are in reverse proportion to each other. On the other hand, the resolution must be as high as several nm to observe very fine defects when the sizes of defects to be observed are in the order of several nm. In a region of an objective divergence angle having a practical focal depth, the resolution is dominated by the diffraction error and it is improved proportionally to the objective divergence angle 43. Because the focal depth and the resolution are parameters that are contrary to each other, the review SEM is required to have a plurality of optical modes in which the balance between focal depth and resolution is changed respectively. And as described above, the plurality of optical modes are, for example, a high resolution mode that takes precedence to small probe current and resolution, a review mode that takes a balance between focal depth and resolution, a long focal depth mode that takes precedence to focal depth, etc. The operator of the review SEM can select a proper optimal optical mode according to how the inspection is to be made.

The balance between focal depth and resolution must be designed severely, since a conflict comes to occur unavoidably between a request for raising the resolution to observe fine defects and a request for securing a satisfactory focal depth. This is because the objective divergence angle must be set more accurately to determine those two performance requirements.

The review SEM described above is required to replace the objective aperture with a new one once or so every year, since the objective aperture is often contaminated with foreign matters when the apparatus is started up or during operations, thereby the observation images are degraded in quality. In addition, the objective aperture cannot avoid the diameter variation of more than 10% to occur among manufacturing processes respectively. Furthermore, when the objective aperture is replaced with a new one, each of the probe current and the objective divergence angle also comes to change by more than 10%. Such an objective aperture diameter variation to occur among manufacturing processes comes to affect diversely the balance between focal depth and resolution that are designed severely in each optical mode and results in generating a performance difference between apparatuses to disable the guarantee of their performance.

The charged particle beam apparatus in this first embodiment controls each of the probe current and the objective divergence angle independently, controls the first condenser lens setting device automatically so as to obtain a desired probe current in accordance with the objective aperture diameter, and controls the second condenser lens setting means automatically so as to obtain a desired objective divergence angle.

Figure 2:
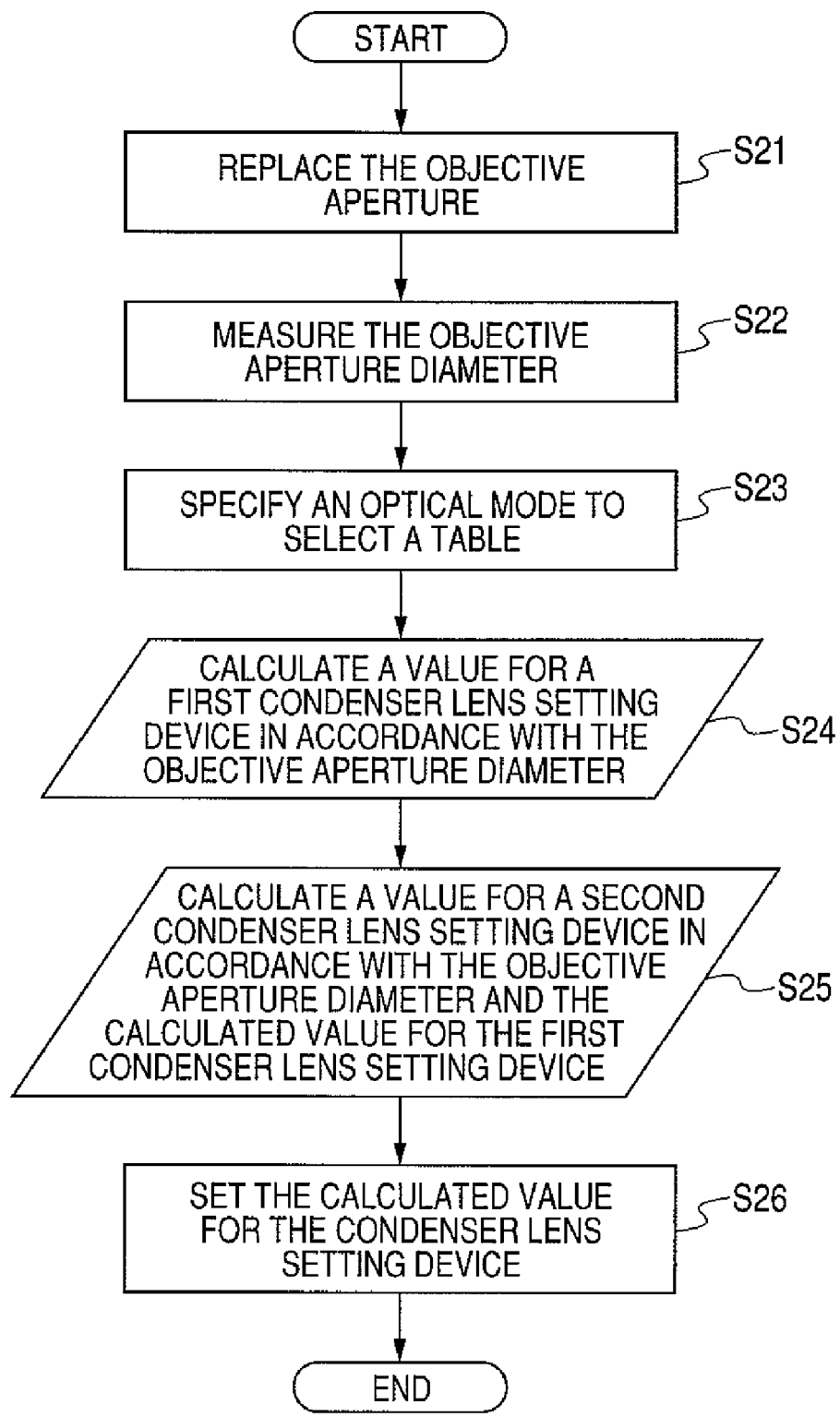
FIG. 2 is a flowchart of the procedures for adjusting an objective divergence angle when the objective aperture diameter is measured in the review SEM in the first embodiment.

FIG. 2 is a flowchart of the procedures for adjusting the objective divergence angle 43 in an example upon replacing the objective aperture 6 in the review SEM in this first embodiment.

Figure 4:
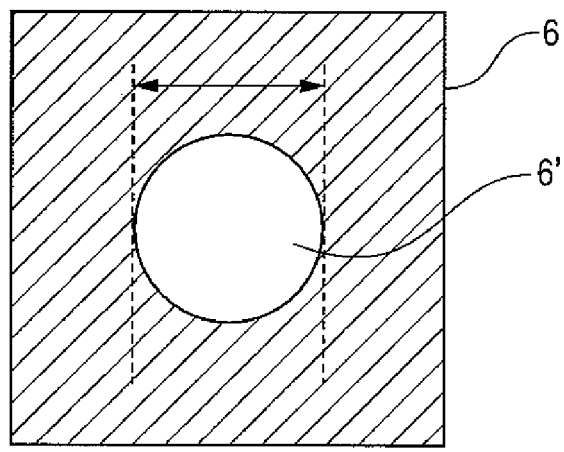
FIG. 4 is an SEM image displayed on an image display device in the first embodiment.

At first, the objective aperture 6 is replaced with a new one (S21). Then, the value of the first lens setting device is inputted to the first lens setting device 61. The value is used to position the cross-over point 41 stored beforehand in the memory device 67 at the objective aperture 6. The primary electron beam is thus focused by the condenser lens 4. After this, the alignment coil 5 is used to scan the primary electron beam on the objective aperture 6 two-dimensionally. If the primary electron beam passes through the hole 6' of the objective aperture 6 and reaches the wafer 12, the SE detector 32 can obtain strong signals. If the primary electron beam is limited by the objective aperture 6, the SE detector 32 cannot obtain strong signals. In this case, the SEM image is displayed on the image display device 65 as shown in FIG. 4, thereby the hole 6' of the objective aperture 6 can be observed in detail. Then, the scan SEM image is inputted from the image processor 64 to the length measuring device 66 to measure the length of the highlighted portion and the measured length is inputted to the computing device 68 (S22). The SEM image of the objective aperture may be displayed as signals of an ammeter connected to the objective aperture 6 synchronously with the scanning of the primary electron beam. In this case, if the primary electron beam passes through the hole 6' of the objective aperture 6, no signal is obtained from the ammeter. If the primary electron beam scans on the objective aperture 6, the signals are obtained from the ammeter. The contrast of the SEM image is thus inverted from that shown in FIG. 4.

The memory device 67 stores the value of the condenser lens setting device 60 in accordance with the diameter of the objective aperture so as to obtain a set probe current and the value of the condenser lens setting device 62 in accordance with the diameter of the objective aperture and the value of the condenser lens setting device 60 so as to obtain a set objective divergence angle beforehand in each optical mode. The tables as shown in FIG. 9 or equations may also be stored in the memory device 67 instead of those values. In FIG. 9, three tables are shown corresponding to the first to third optical modes respectively. Concretely, the diameters of the objective aperture and the values of the condenser lens setting device 60 are stored in those three tables corresponding to the three optical modes respectively.

Next, one of the first to third optical modes is specified on the image display device 65 through the input device 65 to select a table or equation (S23) and calculate a value of the lens setting device controller 61 in accordance with the diameter of the objective aperture (S24). After this, the table or equation that represents the value of the lens setting device controller 63 is inputted from the memory device 67 to the computing device 68. The value corresponds to the diameter of the objective aperture and the lens setting device controller 61. Furthermore, the measured diameter of the objective aperture is inputted from the length measuring device 66 to the computing device 68 to calculate a value to be set for the lens setting device controller 63 (S25). The value calculated by the computing device 68 is then inputted to each of the lens setting device controllers 61 and 63, thereby the adjustment of the probe current and the objective divergence angle are completed.

Second Embodiment

Figure 3:
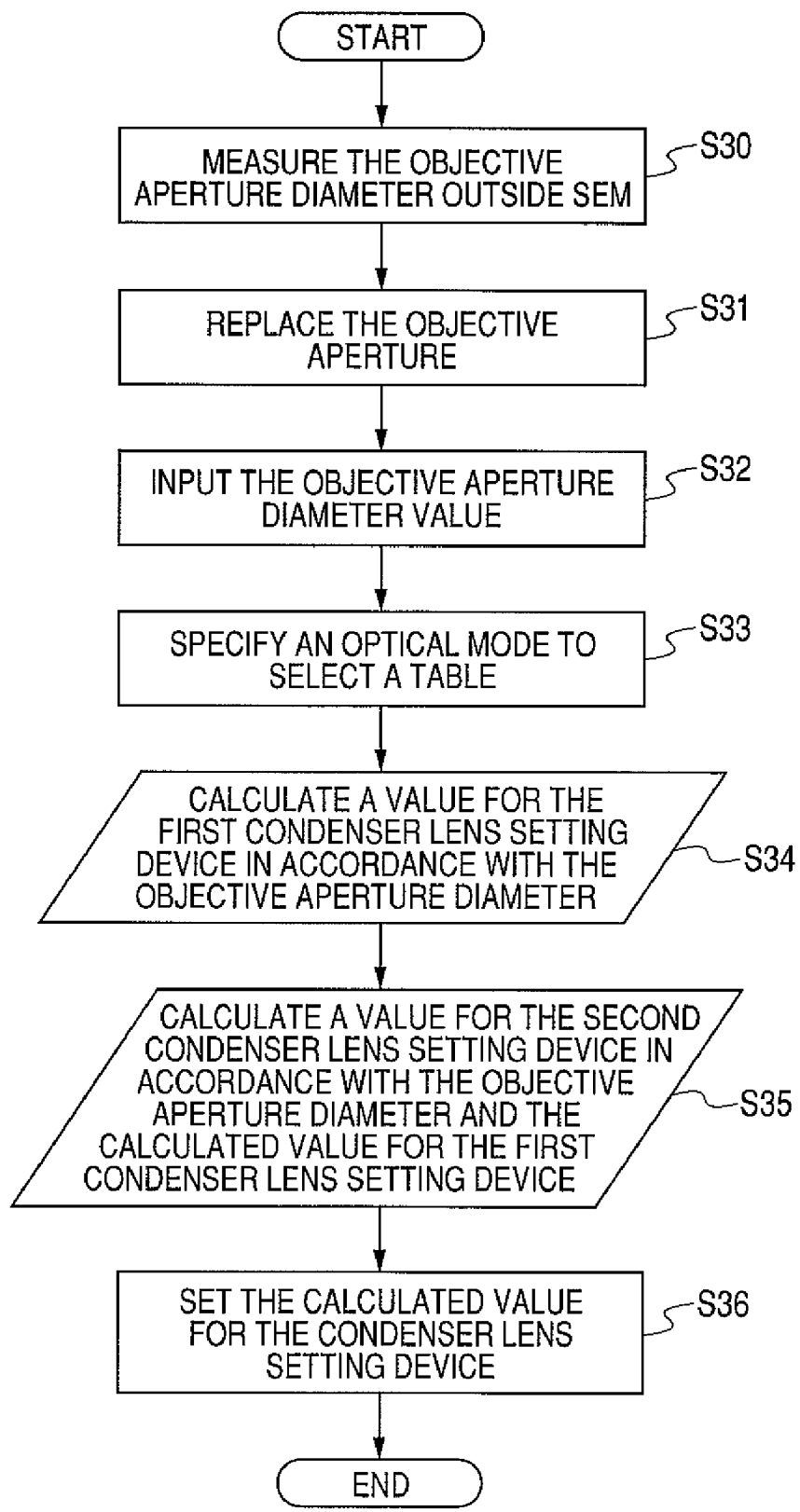
FIG. 3 is a flowchart of the procedures for adjusting the objective divergence angle when the objective aperture diameter is measured outside a review SEM in a second embodiment.

Here, it is also possible to measure the diameter of the hole 6' of the objective aperture 6 outside the review SEM by observing the diameter through an optical microscope before replacing the objective aperture with a new one. FIG. 3 is a flowchart of the procedures for how to adjust the objective diversion angle 43 in this second embodiment when the diameter of the hole 6' of the objective aperture 6 is measured outside the SEM upon replacing the objective aperture 6 with a new one in the review SEM.

At first, the diameter of the hole 6' of the new objective aperture 6 is measured by using an optical microscope or the like (S30). Then, the objective aperture 6 is replaced with the new one (S31). The measurement result is inputted to the computing device 68 from the input device 69 (S32).

After this, the value (first control value) of the lens setting device controller 61 is calculated in accordance with the inputted value of the diameter of the hole 6' of the objective aperture 6 just like the measurement method described above. Then, the value (second control value) of the lens setting device controller 63 is calculated in accordance with both of the diameter of the hole 6' of the objective aperture 6 and the value of the lens setting device controller 61. The calculated values are then inputted to the lens setting device controllers 61 and 63 respectively, thereby the adjustment of the probe current and the objective divergence angle are completed.

The same adjustments are also possible even when the memory device 67 does not store any of the table and equation in each optical mode for representing the value of the lens setting device controller 61 in accordance with the diameter of the hole 6' of the objective aperture 6 and the table or equation in each optical mode for representing the value of the objective diversion angle 43 in accordance with the objective aperture 6 and the lens setting device controller 63.

Third Embodiment

Figure 6:
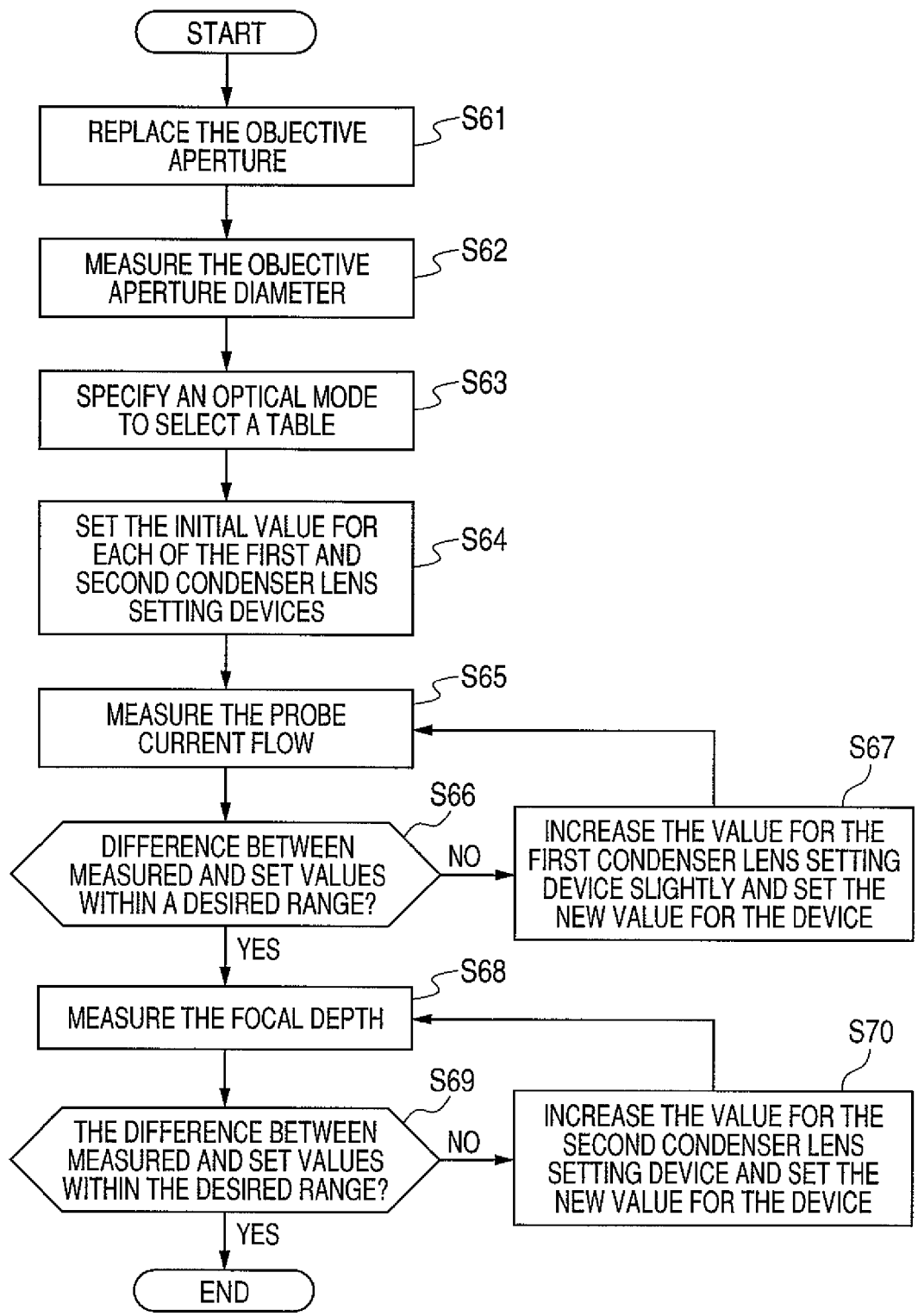
FIG. 6 is a flowchart of the procedures for adjusting the objective divergence angle when there is none of tables and equations for representing the value of a condenser lens setting device in accordance with the objective aperture diameter in the review SEM in a third embodiment.

FIG. 6 is a flowchart of the procedures for adjusting the objective diversion angle 43 upon replacing the objective aperture 6 with a new one in this third embodiment.

At first, the objective aperture 6 is replaced with a new one in this third embodiment. Then, the diameter of the hole 6' of the objective aperture 6 is measured in the same way as that in the second embodiment (S62) and the measurement result is inputted to the computing device 68. The measurement of the diameter may be made inside or outside the review SEM. If the measurement is made outside the review SEM, the measured diameter is inputted to the computing device 68 through the input device 69.

Next, one of the optical modes is specified on the image display device 65 from the input device 69 (S63). Then, the standard values (first and second control values) of the lens setting device controllers 61 and 63 in the specified optical mode are read from the memory device 67 and inputted to the lens setting device controllers 61 and 63 as initial values (S64).

Then, the probe current is measured (S65) and it is checked whether or not the difference between the measured probe current and the probe current set in the selected optical mode is within a desired range (S66). If not in the range, the value of the lens setting device controller 61 is increased slightly and it is reset (S67). Then, the measurement and comparison are carried out again. If the measured probe current is almost equal to that set in the selected optical mode, that is, if the difference is within the desired range, control goes to the focal depth measurement (S68).

Figure 7:
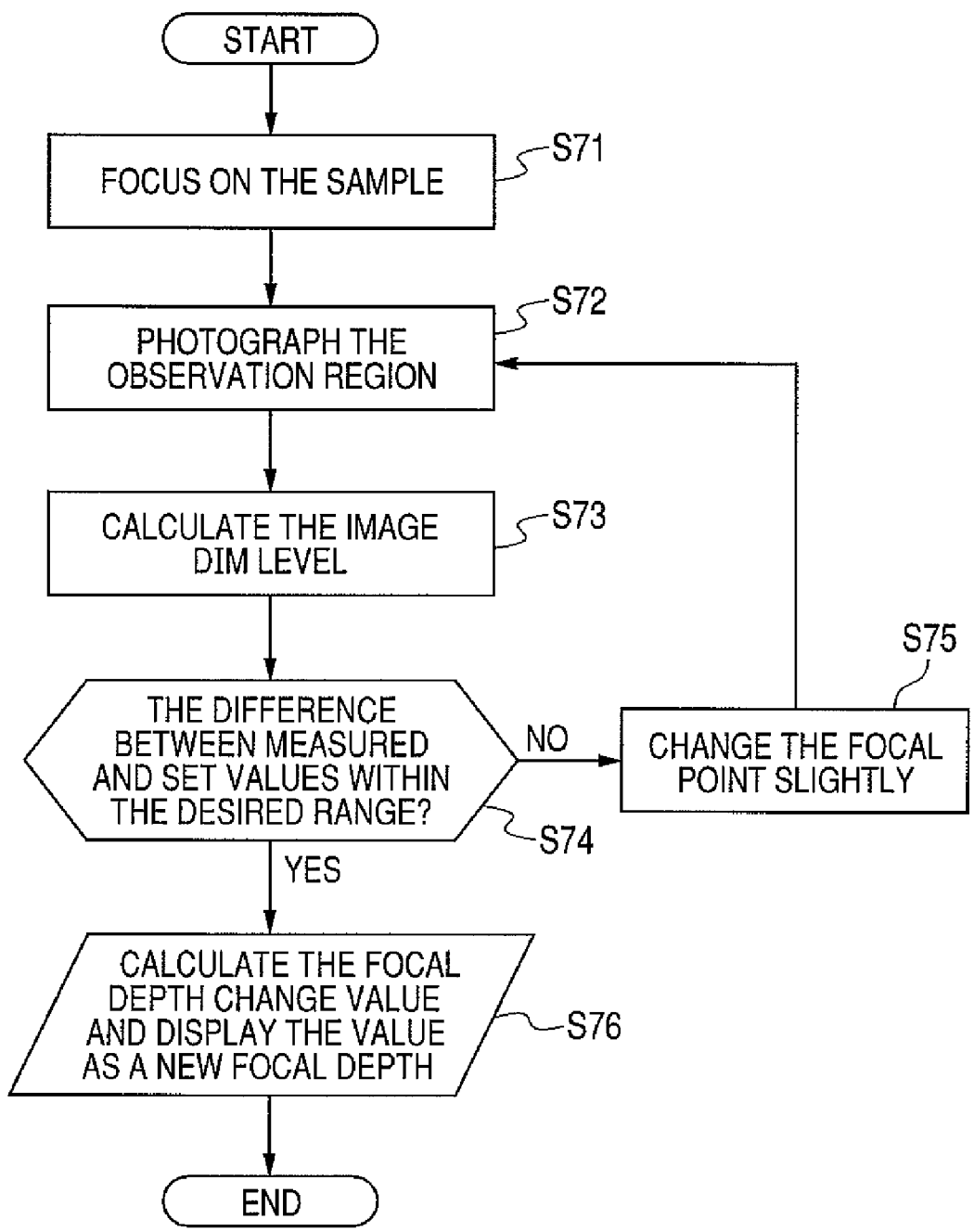
FIG. 7 is a flowchart of the procedures for measuring a focal depth in the third embodiment.

FIG. 7 is a flowchart of the procedures for measuring a focal depth. The lens setting device controller 63 has an already-inputted selected optical mode standard value as its initial value.

At first, the objective lens 10 focuses the beam on the sample substrate (S71) to photograph an observation region thereon (S72). After this, the dim level of the image obtained by the image processor 64 is calculated by using a dim level quantitative method such as the Contrast-to-Gradient (CG) method (e.g., JP-A 2007-207763). The calculated value is output to the computing device 68. The CG method is not only one dim level quantitative method.

At the same time, the dim level set in each optical mode and stored beforehand in the memory device 67 is inputted to the computing device 68 so as to be compared with the dim level of the obtained image. Then, it is determined whether or not they are almost the same, that is, whether or not the difference is within the desired range (S74). If the result is "almost the same as the set value", the focal point is changed slightly (S75) to photograph the observation region again, calculate the dim level of the image, and make a comparison between those dim levels. In this case, the focal point is changed by changing the power of any of the objective lens 10, the booster voltage power supply 13, and the retarding power supply 14. At this time, the change of the focal point is related to the level changes of the objective lens 10, the booster voltage power supply 13, and the retarding power supply 14.

Figure 8:
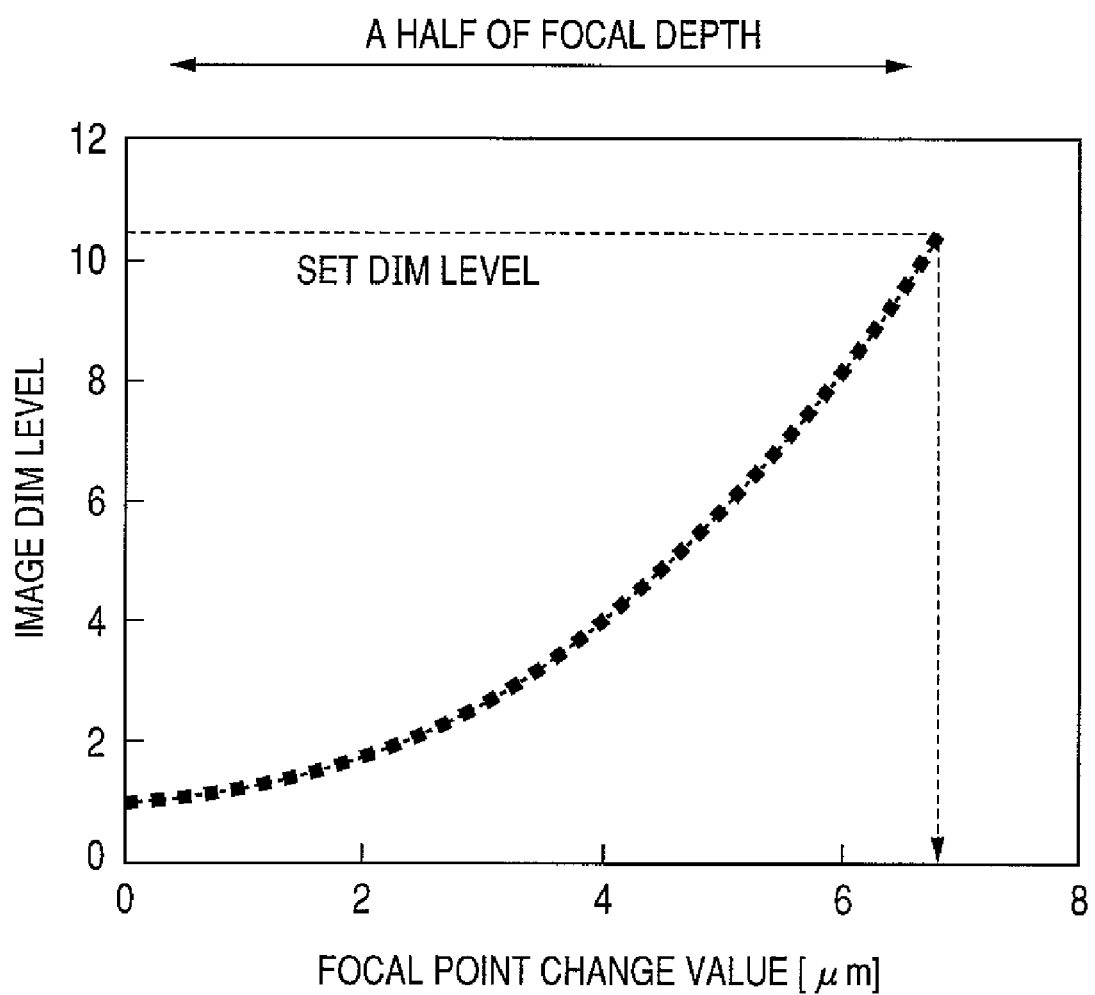
FIG. 8 is a graph for describing a relationship between focal point changes and image dim levels in the third embodiment.

If the dim level of the image is almost the same as the set value, that is, if the difference between the two dim levels is within the desired range, the focal point change value of the photographed image is doubled, then the result is output as a focal depth to display the object image on the image display device 65 (S76). FIG. 8 is a graph for representing a relationship between the focal point change value and the image dim level in an example after an image is obtained and its dim level is calculated while changing the focal point. In FIG. 8, the horizontal axis denotes the focal point change values (μm) when the just focal point is defined as 0 and the vertical axis denotes the image dim level. This graph shows that the lower the dim level is, the higher the resolution of the image becomes. If the set dim level is assumed to be 10.2, the focal depth becomes double of the focal point change value (distance between the just focal point and the detected focal point), which is about 13.5 μm.

Then, return to FIG. 6. The measured focal depth (S68) is compared with the focal depth set in the selected optical mode to determine whether or not both are almost the same (S69). If the difference between those focal depths is not within the desired range, the value (second control value) of the lens setting device controller 63 is increased slightly (S70), then the flowchart of the focal depth measurement is carried out again to calculate the focal depth.

When the measured focal depth becomes almost the same as the focal depth set in the selected optical mode, that is, when the difference settles within the desired range, the adjustment of the objective divergence angle is completed.

Each time the objective aperture is replaced with a new one, the memory device 67 stores a measured or inputted diameter of the hole 6' of the objective aperture, a value to be set for the lens setting device controller 61 adjusted so as to obtain a desired probe current, and a value to be set for the lens setting device controller 63 adjusted so as to obtain a desired focal depth. The table or equation in each optical mode, representing the value of the lens setting device controller 61 corresponding to the diameter of the hole 6' of the objective aperture 6 and the table or equation in each optical mode, representing the value of the objective divergence angle 43 corresponding to the objective aperture 6 and the lens setting device controller 63 are accumulated sequentially. Consequently, upon replacing the objective aperture with a new one next time, it is just required by referring to the table or equation to adjust the objective aperture. Thus the adjustment can be made more quickly. This is an advantage in this embodiment.

In the flowchart described above in this embodiment, the objective aperture diameter measurement or input can be omitted.

While the preferred embodiments of the present invention have been described with respect to the application to a review SEM, the present invention can also apply to any other charged particle beam apparatuses such as any of SEM and ion beam irradiation apparatuses, which includes a CD-SEM and a general-purpose SEM respectively.

What is claimed is:

1. A charged particle beam apparatus, comprising:
   a charged particle beam source;
   a scanning device for irradiating a desired region of a sample with a primary charged particle beam;
   a display device for displaying secondary charged particles generated from the desired region irradiated by the primary charged particle beam as an image;
   a first condenser lens for focusing the primary charged particle beam;
   a second condenser lens disposed closer to the sample than the first condenser lens;
   an objective aperture disposed between the first and second condenser lenses;
   a movable mechanism for taking off the objective aperture from the charged particle beam apparatus;
   a first lens setting device and a second lens setting device for setting an excitation value for the first and second condenser lenses, respectively;
   a controller configured for controlling the first and second lens setting devices;
   an alignment coil disposed closer to the charged particle beam source than the objective aperture for scanning the primary charged particle beam on the objective aperture;
   a length measuring device for measuring a diameter of the objective aperture from an image scanned by the alignment coil;
   an ammeter for measuring an amount of the charged particle beam;
   an input device for inputting probe current, dim level, and focal depth;
   a memory device for storing images displayed on the display device, and storing inputted probe current, dim level, focal depth, and the diameter of the objective aperture; and
   a computing device configured for calculating the image dim level of stored images, detecting focal depth as the difference between calculated image dim level and inputted dim level, taking the difference between the detected probe current and its inputted value, and taking the difference between the detected focal depth and its inputted value,
   wherein the computing device orders the controller to control the first lens setting device until the difference between the detected probe current and its inputting value converges within a desired range, and
   wherein the computing device orders the controller to control the second lens setting device until the difference between the detected focal depth and its inputting value converges within a desired range.

2. The charged particle beam apparatus according to claim 1, further comprising:
   a memory device for storing the first control value of the first lens setting device and the initial second control value of the second lens setting device in each of a first and a second optical modes, and
   wherein the controller reads the initial value from the memory device in accordance with the specified one of the optical modes to control the first and second lens setting devices according to the read initial value respectively.

3. The charged particle beam apparatus according to claim 2, wherein the first and second optical modes include a high resolution mode that takes precedence to resolution and a long focal depth mode that takes precedence to focal depth.

* * * * *